United States Patent
Kang et al.

(10) Patent No.: US 8,455,896 B2
(45) Date of Patent: Jun. 4, 2013

(54) ORGANIC LED AND MANUFACTURING METHOD THEREOF

(75) Inventors: Min-Soo Kang, Daejeon (KR); Se-Hwan Son, Daejeon (KR); Hyeon Choi, Daejeon (KR); Jung-Bum Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 153 days.

(21) Appl. No.: 12/994,082

(22) PCT Filed: May 22, 2009

(86) PCT No.: PCT/KR2009/002734
§ 371 (c)(1),
(2), (4) Date: Nov. 22, 2010

(87) PCT Pub. No.: WO2009/142462
PCT Pub. Date: Nov. 26, 2009

(65) Prior Publication Data
US 2011/0073897 A1 Mar. 31, 2011

(30) Foreign Application Priority Data
May 23, 2008 (KR) .................. 10-2008-0048216

(51) Int. Cl.
*H01L 33/00* (2010.01)
(52) U.S. Cl.
USPC .............. 257/98; 257/99; 438/29; 313/504
(58) Field of Classification Search
USPC ......... 257/98, 99, E51.018; 438/29; 313/504, 313/512
See application file for complete search history.

(56) References Cited

U.S. PATENT DOCUMENTS

| 5,707,745 | A | 1/1998 | Forrest et al. |
| 7,576,483 | B2* | 8/2009 | Kobori .................. 313/504 |
| 2003/0164496 | A1 | 9/2003 | Do et al. |
| 2003/0164679 | A1* | 9/2003 | Hamano et al. ............. 313/504 |
| 2004/0195962 | A1 | 10/2004 | Nakamura et al. |
| 2006/0049745 | A1 | 3/2006 | Handa et al. |
| 2007/0114520 | A1* | 5/2007 | Garditz et al. .................. 257/40 |
| 2007/0126358 | A1* | 6/2007 | Okutani et al. ............... 313/512 |
| 2007/0254162 | A1 | 11/2007 | Kozaki et al. |
| 2008/0108270 | A1 | 5/2008 | Hama |
| 2009/0211633 | A1* | 8/2009 | Schilinsky et al. ........... 136/256 |

FOREIGN PATENT DOCUMENTS

| JP | 2004-031221 | A | 1/2004 |
| JP | 2004/031221 | A | 1/2004 |
| JP | 2004-47298 | A | 2/2004 |
| JP | 2004-164902 | A | 6/2004 |

(Continued)

OTHER PUBLICATIONS

D'Andrade B W et al.: Organic light-emitting device luminaire for illumination applications, Applied Physics Letters, AIP, American Institute of Physics, vol. 88, Jan. 1, 2006, pp. 192908.1-192908.3, XP002636448.

*Primary Examiner* — Phuc Dang
(74) *Attorney, Agent, or Firm* — McKenna Long & Aldridge, LLP

(57) ABSTRACT

The present invention provides an organic light emitting diode comprising a substrate, a first electrode provided on the substrate, one or more organic material layers provided on the first electrode, a second electrode provided on the organic material layer, and a light extraction layer provided on the top portion of the second electrode, and a method for manufacturing the same. The organic light emitting diode according to the present invention minimizes total internal reflection of the light emitted from a device to improve the light emitting efficiency.

32 Claims, 12 Drawing Sheets

FOREIGN PATENT DOCUMENTS

| | | |
|---|---|---|
| JP | 2007-242601 A | 9/2007 |
| JP | 2008-010410 A | 1/2008 |
| KR | 10-2003-0070985 A | 3/2003 |
| KR | 10-2004-0047670 A | 6/2004 |
| KR | 10-2005-0111348 A | 11/2005 |
| KR | 10-2007-0102947 A | 10/2007 |

\* cited by examiner

ORGANIC LED AND MANUFACTURING METHOD THEREOF

This application is a National Stage Application of PCT/KR2009/002734, filed on May 22, 2009, which claims the benefit of Korean Patent Application No. 10-2008-0048216, filed May 23, 2008, each of which are hereby incorporated by reference for all purposes as if fully set forth herein in their entireties.

TECHNICAL FIELD

The present invention relates to an organic light emitting diode and a method for manufacturing the same. More particularly, the present invention relates to an organic light emitting diode, which minimizes total internal reflection of the light emitted from a device to improve the external light efficiency, and a method for manufacturing the same.

This application claims priority from Korean Patent Application No. 10-2008-0048216 filed on May 23, 2008 in the Korean Intellectual Property Office (KIPO), the disclosure of which is incorporated herein by reference in its entirety.

BACKGROUND ART

As shown in FIG. 1, an organic light emitting diode (OLED) consists of two electrodes, i.e., anode 20 and cathode 40, which are formed on a substrate 10 having a proper mechanical strength and flatness, and thin-film multilayers of organic material 30 sandwiched therebetween. Such organic light emitting diode is commercially applied in the manufacture of color flat display, and many studies have been recently made on lighting applications of OLEDs.

In general, organic light emitting diode is operated by a phenomenon in which holes and electrons are injected from the anode and the cathode into the organic material, respectively and the recombination of these charge carriers causes light to emit from the device. At this time, a driving voltage is affected by a hole injection barrier height at the interface between the anode material and the organic material, and an electron injection barrier height at the interface between the cathode material and the organic material.

Organic light emitting diode is required to have the properties of high power efficiency and durability. To achieve such properties, the organic material constituting the device has a multilayer structure of a hole injection layer 31, a hole transport layer 32, a light emitting layer 33, and an electron transport layer 34, as shown in FIG. 2, and materials having a new and stable molecular structure have been continuously developed as the organic material constituting each layer.

In the organic light emitting diode having such structure, a light extraction layer is provided on the bottom portion of the substrate to prevent total internal reflection of the light emitted from the device at the interface between the substrate and air. FIG. 3 illustrates an organic light emitting diode that is provided with a light extraction layer 90 on the bottom portion of the substrate.

In particular, the light emitting layer consists of a host material that receives electrons and holes at the same time and a dopant that efficiently converts excitons formed by the recombination of electrons and holes into light. Conventionally, a fluorescent dopant that converts a singlet exciton into light has been used. Recently, a phosphorous dopant that converts a triplet exciton into light is adopted to manufacture a device with high quantum efficiency.

Recently, the present inventors have invented a new operation, in which electrons and holes are generated between the hole injection layer and the hole transport layer, and each of them is transported to the anode and the light emitting layer, instead of injecting holes from the anode into the hole injection layer. This new operation is to generate charges between the organic materials, instead of injecting holes from the anode. Thus, there is no need to overcome the hole injection barrier, and low driving voltage and high stability are also ensured because of using the charges generated at the stable interface.

In order to effectively inject electrons and holes into the organic layers, various materials have been developed as the cathode and anode materials. Organic light emitting diode is fabricated into a device for emitting light through the substrate (bottom-emission) or a device for emitting light in an opposite direction of the substrate (top-emission). The light emitting direction is determined by transmittance of the electrode, through which light passes. In the case of thickly using a material having a high reflectivity such as aluminum, the electrode reflects light. In the case of using a material having high transparency such as metal oxide or a thin metal film having a thickness of passing light, light passes through the electrode. In addition, if both electrodes have high transparency, light can be emitted from both sides.

In organic light emitting diode, the cathode is required to have the properties of readily injecting electrons into the electron transport layer interfaced therewith. The electron injection from the cathode into the electron transport layer is closely related with a difference between LUMO (Lowest Unoccupied Molecular Orbital) level of the electron transport layer and the work function of the cathode materials, and the difference is called an electron injection barrier. The driving voltage of organic light emitting diode depends on the height of the electron injection barrier. The decreased driving voltage is attributed to a low electron injection barrier, and the increased driving voltage is attributed to a high electron injection barrier. Therefore, in order to reduce the height of the electron injection barrier and drive the device at a low voltage, a metal having a low work function is used. The suitable cathode materials include magnesium (Mg), lithium (Li), cesium (Cs), calcium (Ca) or the like, and they can be mixed with other metals for the purpose of improving interfacial adhesion, antioxidant activity, and reflectivity. Since these materials have the work function less than 4 eV, the electron injection barrier, which is the difference between the work function and LUMO level of the electron transport material, is small. On the contrary, metals having the work function more than 4 eV such as aluminum (Al) can be used as the cathode. However, when aluminum is used as the cathode, a higher driving voltage is required because of its high electron injection barrier. To overcome this problem, as shown in FIG. 14, a thin film of an insulating material 41 is interposed between the organic layer and the cathode 42, thereby greatly reducing the driving voltage. Example of the insulating material is represented by lithium fluoride (LiF). Upon applying a voltage to the device, lithium fluoride, which is formed as a thin film having a thickness of 5 to 30 Å, functions to enhance the electron injection from the cathode into the electron transport layer by tunneling, or lithium atoms having a low work function are generated by chemical reaction between lithium fluoride and aluminum deposited thereon, thereby facilitating the electron injection.

The cathode containing a material having a low work function or aluminum is formed by thermal evaporation. In general, a process of forming an electrode using metal or metal oxide is performed by sputtering, e-beam, CVD, thermal evaporation or the like. However, in the manufacture of organic light emitting diode, a process of forming the cathode is performed after the process of forming the anode and organic material. Thus, thermal evaporation, which requires lower energy in the process of forming the cathode, minimizes damage to the organic material that is previously deposited. For this reason, the cathode material to be used in the manufacture of organic light emitting diode is selected from metals having a relatively low melting point that are available in thermal evaporation.

In addition, the cathode material is chosen depending on whether the light is emitted through the substrate or in an opposite direction of the substrate. In order to emit light through the substrate, the anode placed on the substrate is selected from materials having high transparency, and the cathode is selected from materials having high reflectivity, and thus the light emitting direction is induced from the opposite direction of the substrate toward the substrate. As the cathode suitable for this purpose, the above mentioned aluminum is generally used. On the contrary, in order to emit light in an opposite direction of the substrate, a transparent anode 22 is deposited on a material 21 having high reflectivity or a material having higher reflectivity and high work function (>4.5 eV) is used as the anode, as shown in FIG. 16. At the same time, as shown in FIG. 15, a material having lower reflectivity is formed as a thin film to form the cathode 43, in which in order to prevent surface plasmon that occurs on the thin film cathode or improve conductivity of the thin film cathode, a high transparent dielectric material layer or transparent conductive material layer 44 is formed on the cathode at a proper thickness to increase transparency. The cathode used for this purpose includes magnesium or magnesium-containing alloy, and the high dielectric or transparent conductive material includes metal oxide, oxide of metal mixture, silicon oxide, and silicon nitride, but is not limited thereto.

In order to increase the light intensity per unit area, two or more structures of organic light emitting diode are deposited on one substrate to manufacture a device having a multilayer structure. Such device is characterized in that two or more structures of organic light emitting diode are connected in series, and it includes two external electrodes (anode and cathode) and a charge generation layer interposed between units of the repeating organic light emitting diodes. Such device shows the characteristics that the light intensity per unit area is increased, and the driving voltage increases in proportion to the number of repeating unit, as compared to the general organic light emitting diode, but the current decreases in inverse proportion, so as to improve durability of the device.

As mentioned above, organic light emitting diodes may have a different structure from each other, and therefore, different materials can be employed. However, the devices have the different structure, but some common properties. That is, the common properties are to need a substrate having a mechanical strength suitable for the manufacture of organic light emitting diode, to require two or more electrodes having different polarity on the substrate, and to dispose thin organic material layers having electron transport and light emitting properties between two different polarity electrodes. Two different polarity electrodes are generally divided into cathode and anode, and each of them functions to inject electrons and holes into the organic materials.

DISCLOSURE

Technical Problem

As described above, an object of the present invention is to provide an organic light emitting diode, which minimizes total internal reflection of the light emitted from a device to improve the light efficiency, and a method for manufacturing the same. In particular, the present inventors found that the total internal reflection generated at the interface between a substrate made of glass or plastic and air, as well as the total internal reflection generated between a transparent electrode and substrate, greatly affects the light efficiency, and thus the known method of forming a light extraction layer on the bottom portion of the substrate of organic light emitting diode has limitations in the improvement of light efficiency. Accordingly, on the basis of this fact, an object of the present invention is to provide an organic light emitting diode, which minimizes the total internal reflection generated at the interface between a substrate made of glass or plastic and air, as well as the total internal reflection generated between a transparent electrode and substrate, and a method for manufacturing the same.

Technical Solution

In order to achieve the above objects, the present invention provides an organic light emitting diode comprising a substrate, a first electrode provided on the substrate, one or more organic material layers provided on the first electrode, a second electrode provided on the organic material layer, and a light extraction layer provided on the top portion of the second electrode.

Further, the present invention provides an organic light emitting diode comprising a substrate, a first electrode provided on the substrate, two or more light emitting units that are provided on the first electrode and include one or more organic material layers, a middle electrode provided between the light emitting units, a second electrode provided on the light emitting unit, and a light extraction layer provided on the second electrode.

Further, the present invention provides a method for manufacturing an organic light emitting diode, comprising the steps of forming a first electrode on a substrate, forming one or more organic material layers on the first electrode, forming a second electrode on the organic material layer, and forming a light extraction layer on the top portion of the second electrode.

Further, the present invention provides a method for manufacturing an organic light emitting diode, comprising the steps of forming a first electrode on a substrate, forming two or more light emitting units that includes one or more organic material layers on the first electrode, forming a middle electrode after forming any one of the light emitting units, forming a second electrode on the light emitting unit, and forming a light extraction layer on the second electrode.

Advantageous Effects

Instead of forming a light extraction film on a substrate being in contact with air in the prior art, the present invention provides an organic light emitting diode with high efficiency, which is able to minimize the total internal reflection between the transparent electrode and substrate by forming the light extraction film on a transparent electrode of the uppermost portion in contact with air in the organic light emitting diode comprising two electrodes formed on the substrate and at least one organic material interposed therebetween. Further, since the light extraction film of the organic light emitting diode according to the prior art is exposed to the outside, mechanical friction may induce surface damage. Meanwhile, since the light extraction film of the organic light emitting diode according to the present invention is placed inside the protection substrate, it is not exposed to mechanical friction, leading to improvement in durability.

BEST MODE

Hereinbelow, the present invention will be described in detail.

The organic light emitting diode according to the present invention has a structure comprising a substrate, two electrodes disposed on the substrate, and an organic material layer interposed between two electrodes, in which a light extraction layer is provided on the top portion of the second electrode not being in contact with the substrate, unlike those in the prior art which are provided on the bottom portion of the substrate.

In the organic light emitting diode, light is generated by the organic material layer, and organic light emitting diode is divided into a device for emitting light through the substrate or a device for emitting light in an opposite direction or in both directions of the substrate. In order to emit the light generated by the organic material layer into the outside, the light has to pass through several interfaces depending on the structure of the organic light emitting diode. For example, if the light is emitted through the substrate, the light generated by the organic light emitting layer passes through a hole transport layer, a hole injection layer, a transparent electrode layer, and a substrate, and is emitted into air.

Figure 4:
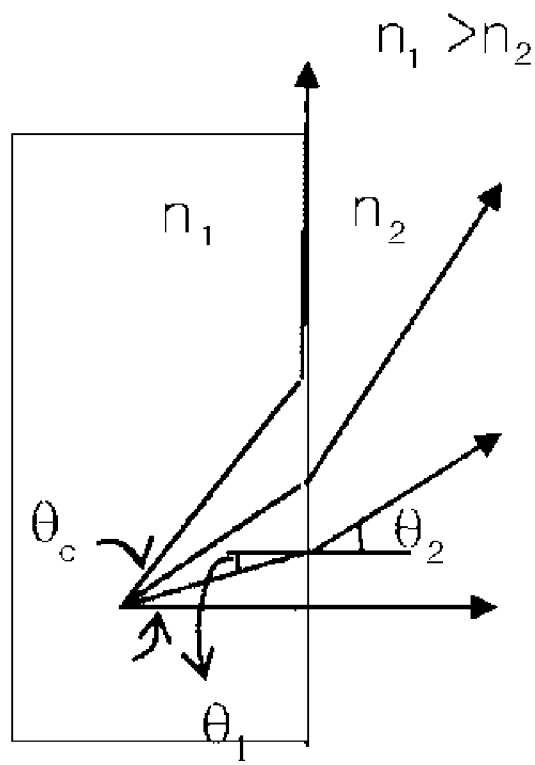
FIG. 4 illustrates the path where light travels from a medium with a high refractive index to one with a low refractive index.

When light travels toward air, it passes through material layers having a different refractive index. As shown in FIG. 4, when light travels from a layer with a higher refractive index to one with a low refractive index, total internal reflection occurs depending on the difference between the refractive indices. For example, a glass or plastic substrate has a refractive index of about 1.5 to 1.6, and air has a refractive index of 1. When light travels from the glass or plastic substrate to air, light corresponding to Formula of $½ n^2$ is only emitted, and other light is trapped in the glass or plastic substrate having a high refractive index due to total internal reflection, and turns into heat.

As a difference in the refractive indices of adjacent media increases, the total internal reflection increases. Thus, in the general organic light emitting diode, the higher total internal reflection occurs at the interface between the substrate (glass or transparent plastic) and air. When light generated at any point in one medium travels to medium having a lower refractive index, an angle formed by a perpendicular line from the point to the interface between two media and a line formed by linking the point with a point at any interface between two media is defined as theta, and an angle to yield total internal reflection is theta $_c=\sin^{-1}(n_2/n_1)$, wherein $n_2$ is a medium having a lower refractive index, and $n_1$ is a medium having a higher refractive index (FIG. 4).

Figure 3:
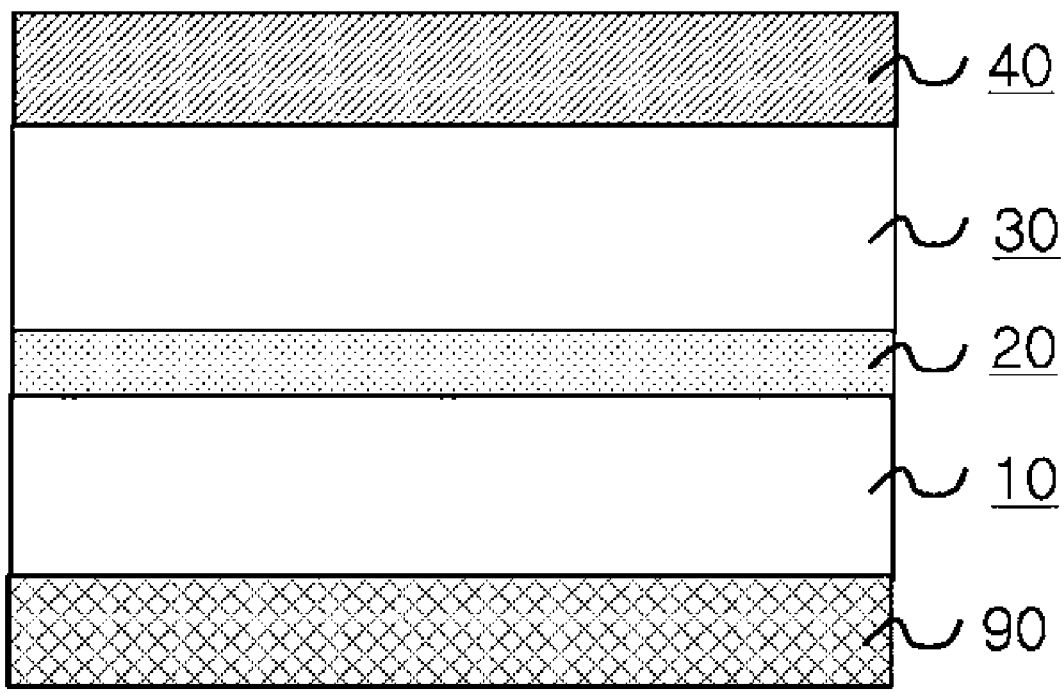
FIG. 3 illustrates the structure of the known organic light emitting diode provided with a light extraction layer on the bottom portion of known substrate.

In order to minimize light loss due to the total internal reflection that occurs between the substrate of organic light emitting diode and air, as shown in FIG. 3, a method of forming a light extraction layer 90 on the bottom portion of the substrate 10 was attempted in the prior art.

Figure 5:
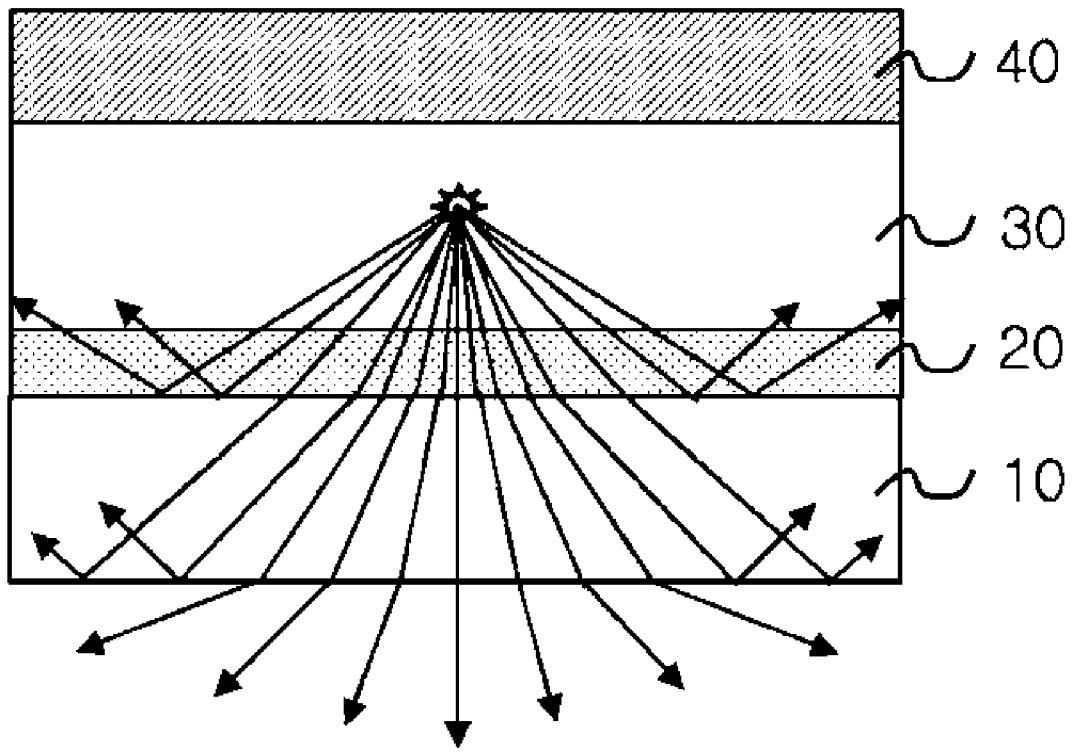
FIG. 5 illustrates the path of light generated from the organic material layer in the bottom emission-type organic light emitting diode.

However, it was recognized that the known method has limitations in the improvement of light extraction efficiency of the organic light emitting diode. In particular, as shown in FIG. 5, the total internal reflection that occurs at the interface between the substrate and air occurs at the interface between the electrode 20 and substrate 10 as well as at the interface between the substrate 10 and air layer, and thus the total internal reflection at the interface between the transparent electrode and substrate, as well as the total internal reflection at the interface between the substrate and air layer, considerably affects the efficiency of extracting light from the device.

According to the prior art, light loss due to the total internal reflection that occurs between the transparent electrode and the substrate cannot be reduced. That is, since the general transparent anode material, ITO or IZO has a refractive index of 1.7 to 2.2, which is higher than the glass or plastic substrate having a refractive index of 1.5 to 1.6, some of the light is not emitted due to the total internal reflection between the transparent electrode and the substrate. About 50% and 30% of light loss are generated at the interface between the electrode and glass substrate and between the glass substrate and air layer, respectively.

Figure 6:
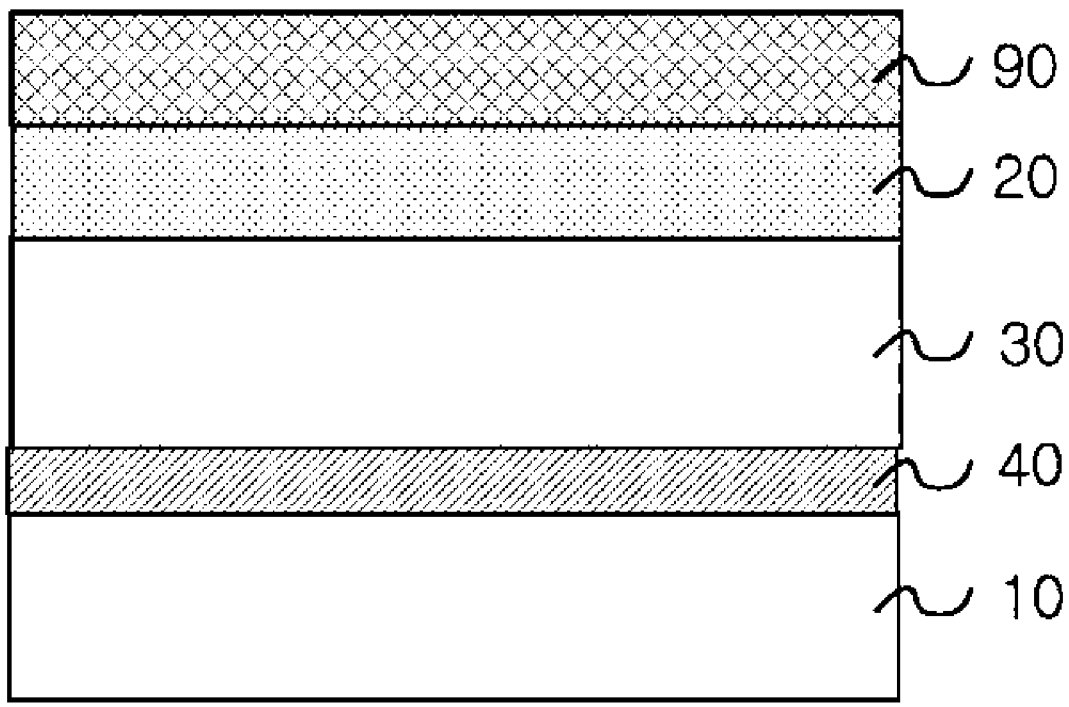
FIG. 6 illustrates the structure of the inverted organic light emitting diode according to the present invention, which is provided with a light extraction layer on the top portion of the upper electrode.

Accordingly, in the present invention, a light extraction layer is formed on the upper electrode, not on the bottom portion of the substrate of the organic light emitting diode, so as to prevent light loss due to the total internal reflection at the interface between the transparent electrode and substrate, as well as the total internal reflection at the interface between the device and air. FIG. 6 illustrates the structure of the device according to the present invention, in which a cathode layer 40 containing a metal with a high reflectivity, an organic material layer 30, and a highly transparent anode layer 20 are sequentially deposited on the top portion of the substrate 10, and the light extraction layer 90 is adhered to the anode layer 20.

In the organic light emitting diode according to the present invention, the structure or material of the light extraction layer is not particularily limited, as long as it is able to improve light extraction from the device.

It is preferable that the light extraction layer has a low light absorption. The useful material is preferably a polymeric material for flexible molding, and a material having transmittance of >50%, and more preferably transmittance of >80% in the visible ray region. When a filler having a refractive index difference of 0.1 or more is added to the polymer, so as to induce scattering for the purpose of improving the light extraction efficiency, each of the polymer forming a film and the material forming a filler preferably has an absorption of <50%, and more preferably an absorption of <30%.

The light extraction layer can be made of a material having a refractive index between that of the upper electrode (second electrode) that is not in contact with the substrate of the device according to the present invention and that of air. Further, in order to improve the light extraction efficiency of the light extraction layer, it is preferable that the light extraction layer has an average refractive index from 1.3 to 2.5. As the light extraction layer has a higher refractive index, the light extraction efficiency is more improved, which can be preferably achieved by increasing a refractive index of the polymer that is used in the formation of the light extraction layer. The light refractive index of the polymer can be affected by atoms constituting the polymer, functional group, and density or the like, and a polymer containing atoms with high atomic number such as oxygen or nitrogen is more preferred than a polymer consisting of carbon and hydrogen. In addition, sulfur or bromine may be included in the molecular structure of the polymer to increase the refractive index.

The light extraction layer is disposed in contact with the second electrode, in which the difference in the refractive index between the light extraction layer and second electrode is preferably 0.5 or less, and more preferably 0.2 or less.

The light extraction layer may be formed in a surface relief structure, a lens structure, a mixed layer structure of materials having different refractive index, or a trapezoidal-cross-section shape, which reduces total internal reflection, but is not limited thereto. The light extraction layer may have a multilayer structure, and divided into a support layer attached to the second electrode (upper electrode) and a layer having a shape for light extraction.

Figure 7:
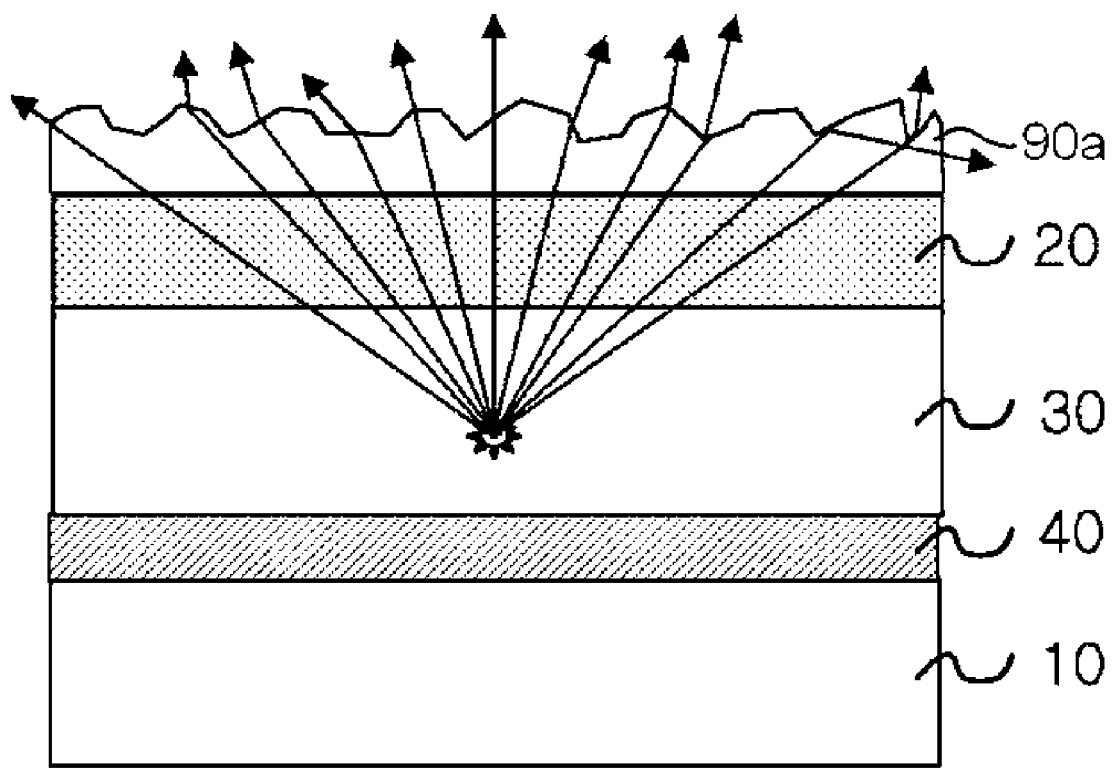
FIGS. 7 to 12 illustrate the light extraction layer that is placed on the upper electrode of the organic light emitting diode according to the present invention.

As shown in FIG. 7, a surface-relief film 90a is attached at the interface between the upper electrode and air or surface-relief is formed on the upper electrode to generate light scattering, thereby preventing total internal reflection of light.

Figure 8:
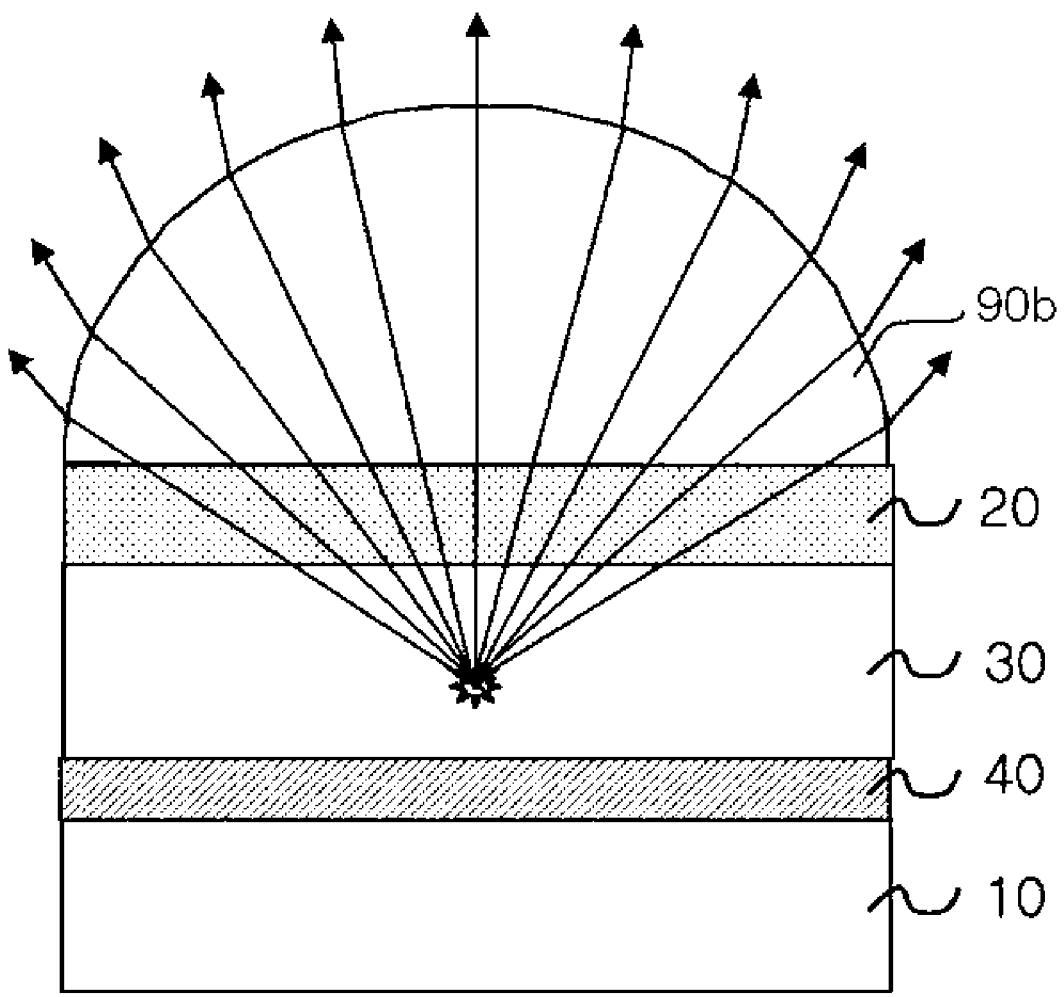

As shown in FIG. 8, a film of hemispherical lens type is attached to the outside of the upper electrode or a hemispherical lens 90b is directly formed on the upper electrode to increase a chance of meeting the light with air within the critical angle, thereby reducing the total internal reflection.

Figure 9:
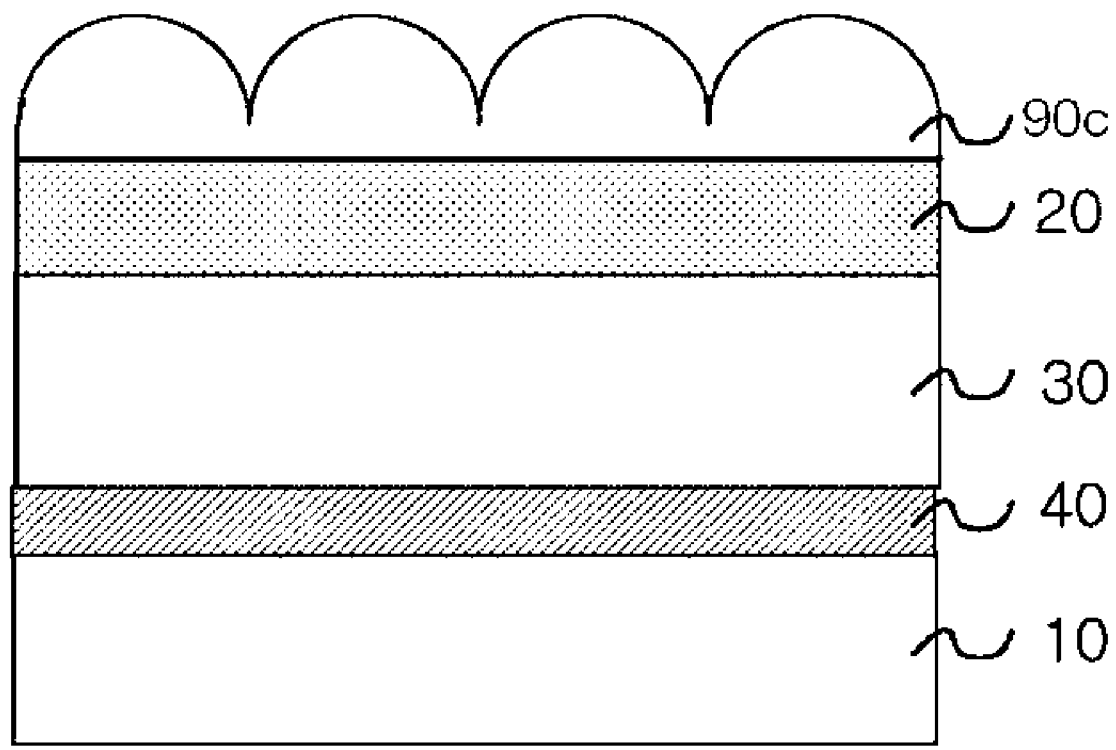

As shown in FIG. 9, the light extraction layer is formed in a film having the repeating hemispherical patterns 90c, in which the radius and height of hemisphere and a space between the hemispherical lenses can be optimized according to the purpose.

Figure 10:
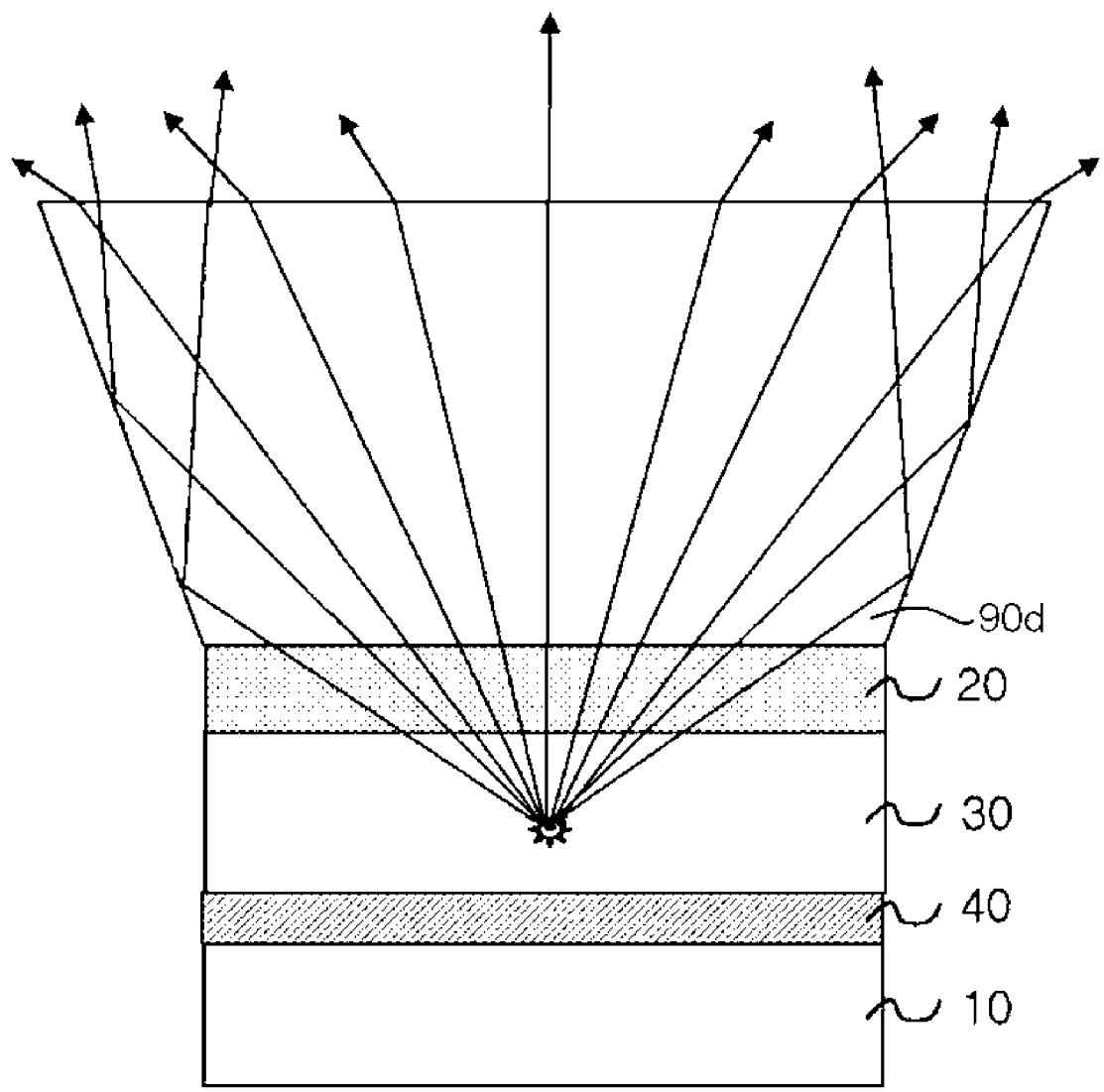
Figure 11:
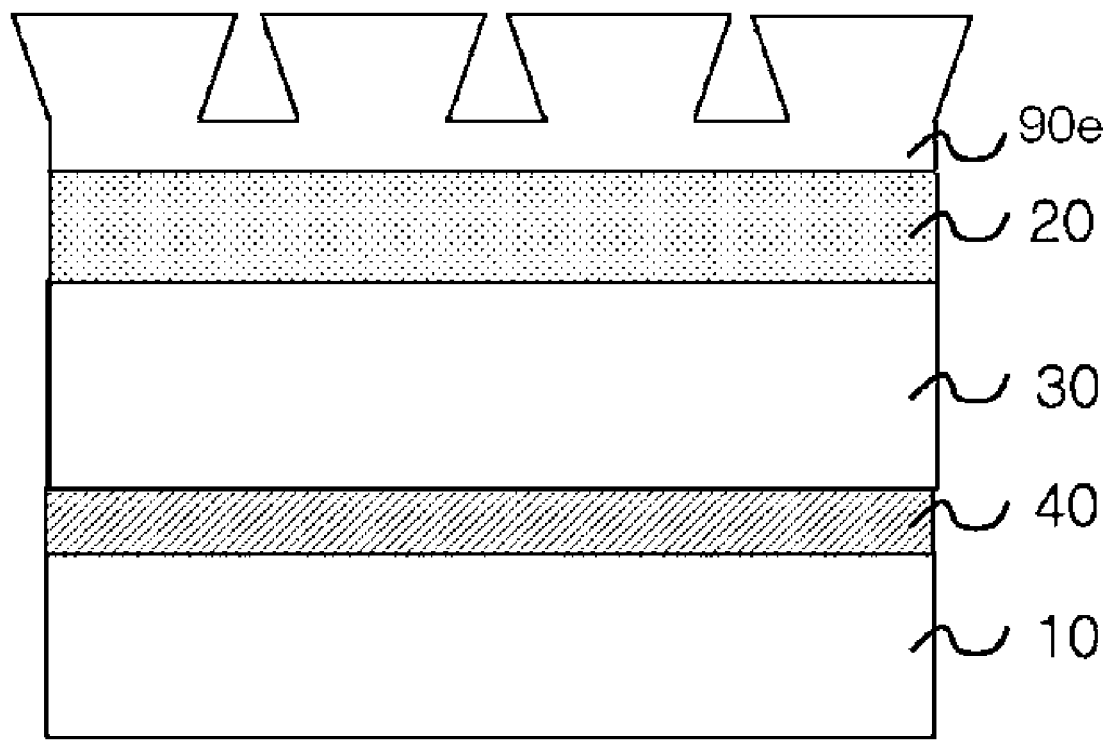

In addition to the hemispherical patterns, as shown in FIG. 10, a film 90d having a shape that is formed by removing the top portion of a cone, namely, a trapezoidal-cross-section shape is attached, and as shown in FIG. 11, a film 90e having the repeating trapezoidal-cross-section shapes is attached thereto.

Figure 12:
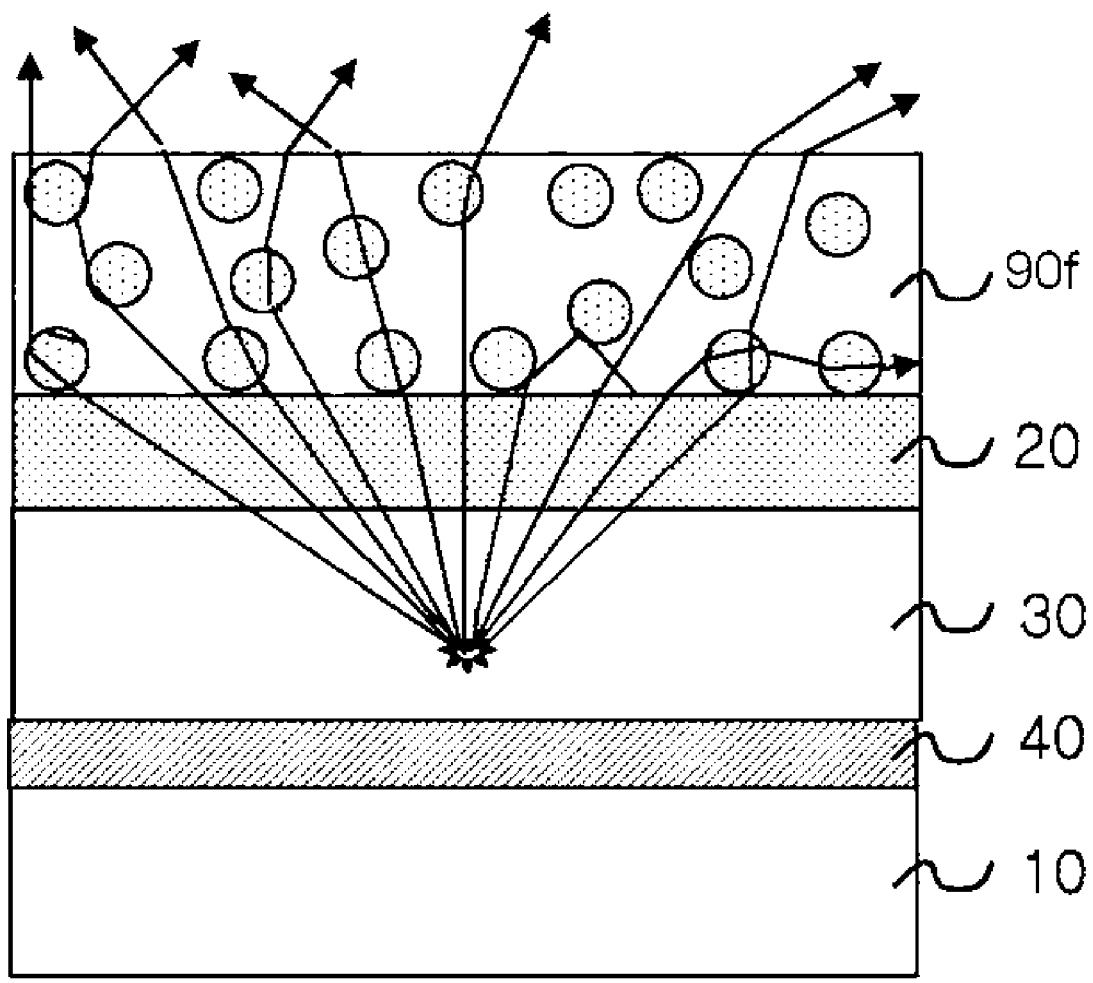

As shown in FIG. 12, a film 90f containing two or more materials having different refractive index is attached to the upper electrode to induce diffused reflection, so as to minimize the total internal reflection, thereby improving the light extraction efficiency.

In the present invention, the constitution of the organic light emitting diode, except the light extraction layer, will be described as follows.

The organic light emitting diode according to one embodiment of the present invention comprises a substrate, a first electrode provided on the substrate, one or more organic material layers provided on the first electrode, and a second electrode provided on the organic material layer, in which the light extraction layer is provided on the upper portion of the second electrode.

Figure 13:
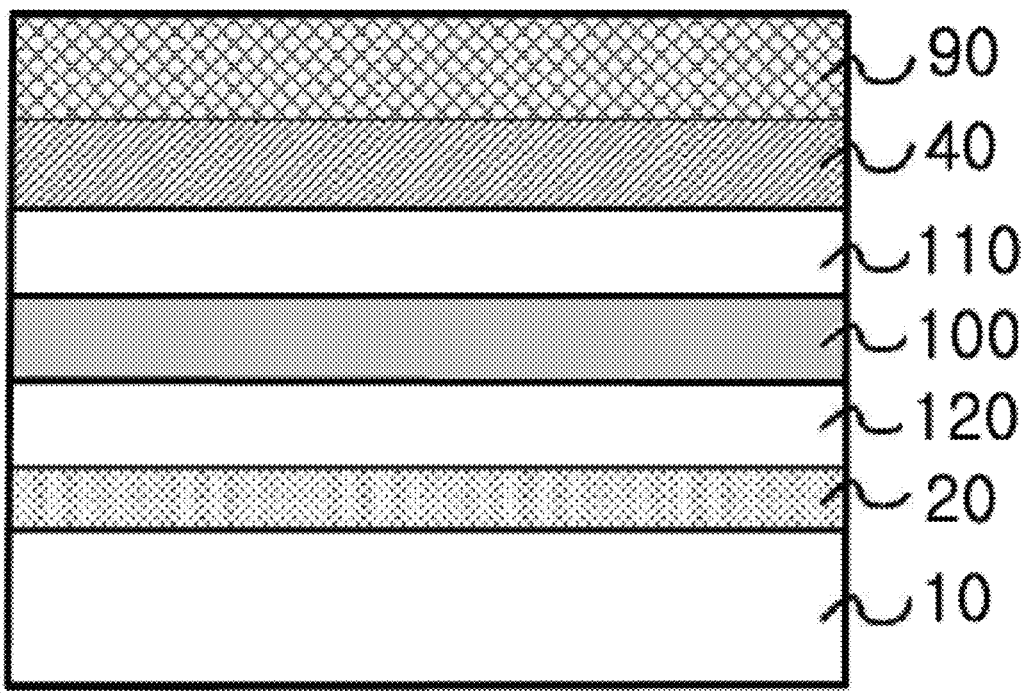
FIG. 13 illustrates the structure of the normal organic light emitting diode according to the present invention, which is provided with a light extraction layer on the top portion of the upper electrode.

The organic light emitting diode according to another embodiment of the present invention comprises a substrate 10, a first electrode 20 provided on the substrate 10, two or more light emitting units 110 and 120 that are provided on the first electrode 20 and include one or more organic material layers, a middle electrode 100 provided between the light emitting units 110 and 120, and a second electrode 40 provided on the light emitting unit, in which a light extraction layer is provided on the second electrode (see FIG. 13).

The organic light emitting diode according to the present invention may be a top emission type or a both-side emission type. In addition, the organic light emitting diode according to the present invention may be a normal OLED, in which the anode is first formed on the substrate, and then organic material layers such as a hole injection layer, a hole transport layer, a light emitting layer, and an electron transport layer are formed, and the cathode is finally formed (see FIG. 13). Reversely, the organic light emitting diode according to the present invention may be an inverted OLED, in which the cathode is first formed on the substrate, and then organic material layers such as an electron transport layer, a light emitting layer, a hole transport layer, and a hole injection layer are formed, and the anode is finally formed. In the present invention, the organic light emitting diode is preferably an inverted OLED, in which the upper electrode is a transparent anode.

In the present invention, the first electrode may be made of a metal having high reflectivity, and a material having a low work function of 4.5 eV or less is preferably used. Specific examples thereof may include aluminum, calcium, magnesium, silver, cesium (Cs), lithium or alloys thereof. Alternatively, a transparent oxide such as ITO (indium tin oxide) or IZO (indium zinc oxide) is used as the first electrode by doping the electron transport material included in the organic material layer with the material having a low work function or an organic material having an n-type property, and thus light can be emitted from both sides of first electrode and second electrode.

Figure 14:
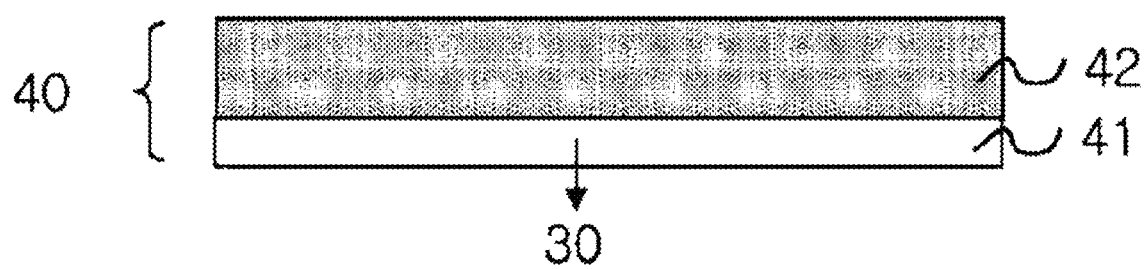
FIGS. 14 to 15 illustrate the structure of the cathode of the organic light emitting diode.

As shown in FIG. 14, if the first electrode is the cathode 42, a thin film of an insulating material 41 is interposed between the cathode and the organic material layer, thereby reducing the driving voltage. Example of the insulating material is represented by lithium fluoride (LiF), but is not limited thereto. Upon applying a voltage to the device, lithium fluoride, which is formed as a thin film having a thickness of 5 to 30 Å, functions to enhance the electron injection from the cathode into the electron transport layer by tunneling, or lithium atoms having a low work function are generated by chemical reaction between lithium fluoride and aluminum deposited thereon, thereby facilitating the electron injection.

The second electrode may be preferably made of a material having a high transmittance, and examples thereof include metal or alloy oxide, specifically, indium tin oxide, indium zinc oxide, oxide prepared by adding other metal such as aluminum, or non-metal, or amphoteric element to the oxide. As the second electrode, a conductive polymer may be used. In addition, the second electrode may be formed as a metal thin film. The second electrode preferably have a light transmittance of 50% or higher. The refractive index of the second electrode is not particularily limited, but when the second electrode is made of a transparent conductive oxide, it has a refractive index of 1.7 to 2.3.

The electrode containing a material with a low work function or aluminum may be formed by thermal evaporation, and a process of forming the electrode using a metal or metal oxide may be performed by sputtering, e-beam, CVD, or thermal evaporation, but is not limited thereto.

Figure 15:
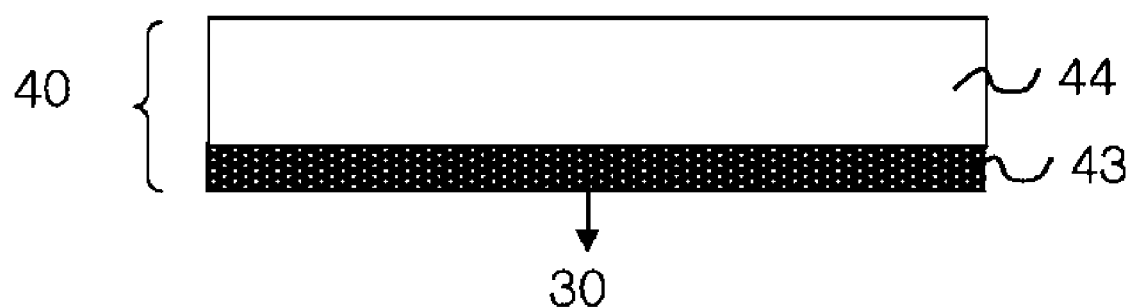
Figure 16:
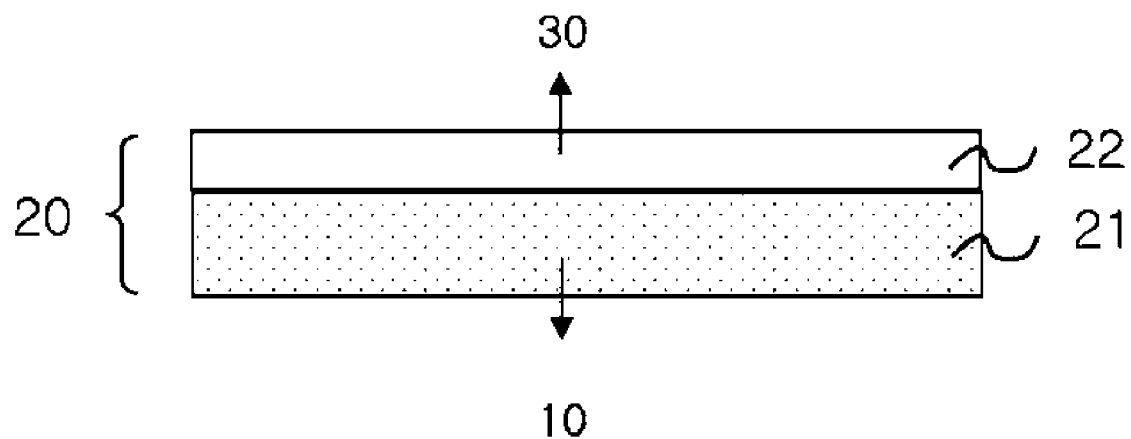
FIG. 16 illustrates the types of the anode of the organic light emitting diode.

If the organic light emitting diode according to the present invention is a top emission type, the second electrode disposed at the opposite side of the substrate may be selected from the materials having high transparency. Thus, the first electrode disposed on the substrate is selected from the materials having high reflectivity to emit light from the side to the opposite side of substrate. In the top emission organic light emitting diode, if the first electrode is the anode, as shown in FIG. 16, a transparent anode 22 is deposited on the material 21 having high reflectivity or a material having higher reflectivity and work function (>4.5 eV) may be used as the anode material. In this connection, as shown in FIG. 15, a material having lower reflectivity is formed as a thin film to form a cathode as the second electrode, in which in order to prevent surface plasmon that occurs on the thin film cathode or improve conductivity of the thin film cathode, a high transparent dielectric material layer or transparent conductive material layer 44 is formed on the cathode at a proper thickness to increase transparency. The cathode used for this purpose includes magnesium or magnesium-containing alloy, and the high dielectric or transparent conductive material includes metal oxide, oxide of metal mixture, silicon oxide, and silicon nitride, but is not limited thereto.

The middle electrode may be made of the materials exemplified as first electrode or second electrode materials.

The organic light emitting diode according to the present invention further comprises a transparent protection layer between the second electrode formed on the organic material layer and the light extraction layer formed on the second electrode, in which the transparent protection layer may be formed by CVD (Chemical Vapor Deposition) using silicon oxide, silicon nitride, silicon oxynitride or the like. By means of this method, the organic light emitting diode can be protected from moisture or oxygen, and mechanical damage that may be generated upon attachment of the light extraction layer can be minimized, simultaneously. The refractive index of silicon oxide, silicon nitride, or silicon oxynitride deposited by the method can be changed by controlling the stoichiometric composition, and the refractive index is optimized to maximize the light extraction efficiency. It is preferable that the protection layer has a refractive index of 1.3 to 2.5, and a thickness of 100 nm to 500 µm.

The protection layer is interposed between the second electrode and the light extraction layer, and the difference in the refractive index between the protection layer and second electrode and the difference in the refractive index between the protection layer and the light extraction layer are preferably 0.5 or less, and more preferably 0.2 or less.

The organic light emitting diode according to the present invention may further comprise an adhesion layer between the second electrode formed on the organic material layer and the light extraction layer formed on the second electrode. The adhesion layer may be made of epoxy or acryl, and an oligomeric material is applied to the light extraction film, and then compressed on the second electrode and attached by heat or UV-curing. By means of this method, the organic light emitting diode can be protected from moisture or oxygen, and mechanical damage that may be generated upon attachment of the light extraction layer can be minimized, simultaneously.

The adhesion layer is interposed between the second electrode and the light extraction layer, and the difference in the refractive index between the adhesion layer and second electrode and the difference in the refractive index between the adhesion layer and the light extraction layer are preferably 0.5 or less, and more preferably 0.2 or less.

The organic material layer constituting the organic light emitting diode of the present invention may be formed using the structure or material known in the art. The organic material layer may consist of a single layer or have a multilayer structure of two or more layers. For example, the organic material layer may comprise a hole injection layer, a hole transport layer, a light emitting layer and an electron transport layer.

Hereinafter, the present invention will be described in more detail with reference to examples. However, these Examples are for illustrative purposes only, and the invention is not intended to be limited by these Examples.

EXAMPLE 1

Aluminum (700 Å) and lithium fluoride (LiF) were sequentially deposited on a transparent glass substrate (Corning 7059 glass) by thermal evaporation to form a cathode. On the cathode, 9,10-bis-2-naphthyl-2-[4-(N-phenylbenzoimidazoyl)phenyl]anthracene (Formula A) was deposited to form an electron transport layer at a thickness of 200 Å. During the above-mentioned process, the deposition rate was maintained at 1 Å/sec. A light emitting host material having a structure of Formula B as the light emitting layer and a dopant material having a structure of Formula C were deposited on the electron transport layer in a vacuum at a volume ratio of 94:6 to form a doped light emitting layer at a thickness of 300 Å. During the process, the deposition rate of the light emitting host was maintained at 1 Å/sec. The compound having a structure of Formula D and the compound having a structure of Formula E were sequentially deposited on the light emitting layer in a vacuum by heating to form a hole transport layer and a hole injection layer at a thickness of 400 Å and 700 Å, respectively. During the process, the deposition rate was maintained at 1 Å/sec. IZO (indium zinc oxide) was deposited on the hole injection layer by sputtering to a thickness of 1750 Å, so as to form an anode. The organic light emitting diode manufactured by the above process had a property of inverted OLED shown in FIG. 6, and the light emitting area of 4 mm$^2$. When a current of 50 mA/cm$^2$ was applied to the organic light emitting diode, the driving voltage was 4.8 V and illuminance was 15.3 lumen. In the organic light emitting diode, a light extraction film, where hemispherical lenses (FIG. 9) having a refractive index of 1.5 and a radius of 25 µm were arranged at an interval of 53 µm in a hexagonal shape, was attached to the IZO anode. When a current being equal to that applied before attachment of the light extraction layer was applied, illuminance of 19.6 lumen was observed. After attachment of the light extraction layer on the anode, the illuminance was improved by 28%.

Formula A

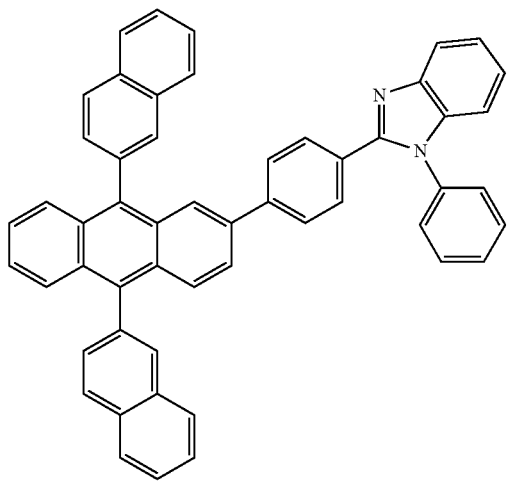

Formula B

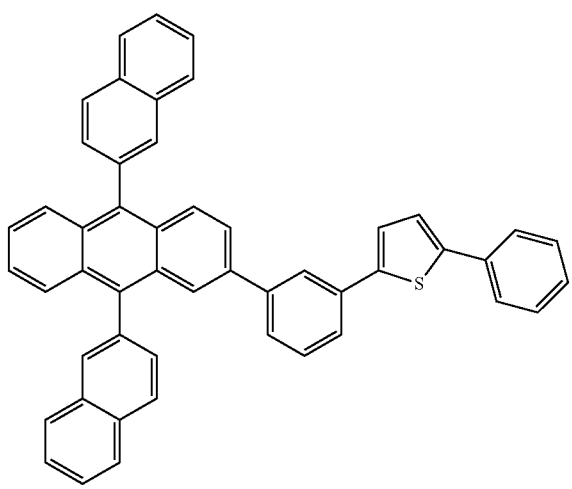

Formula C

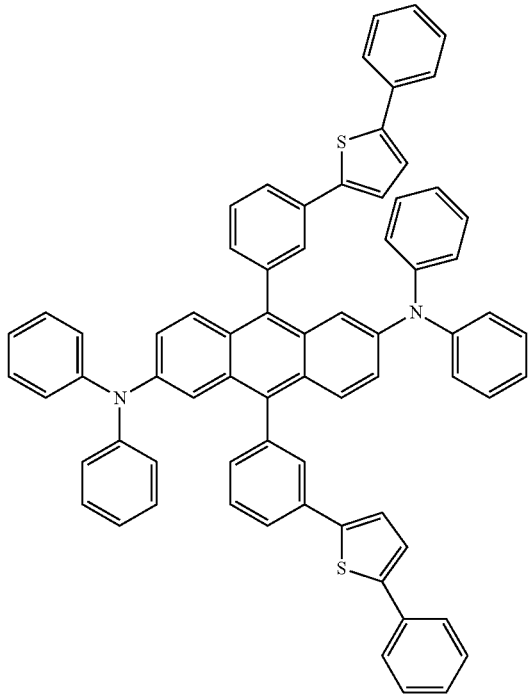

Formula D

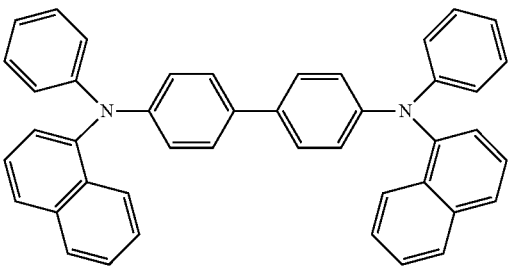

Formula E

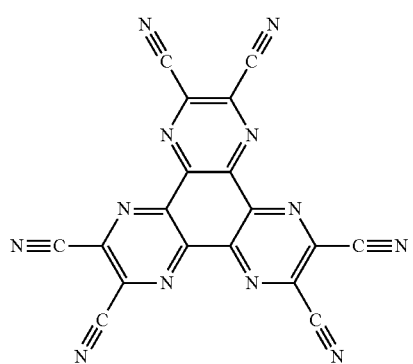

COMPARATIVE EXAMPLE

Figure 1:
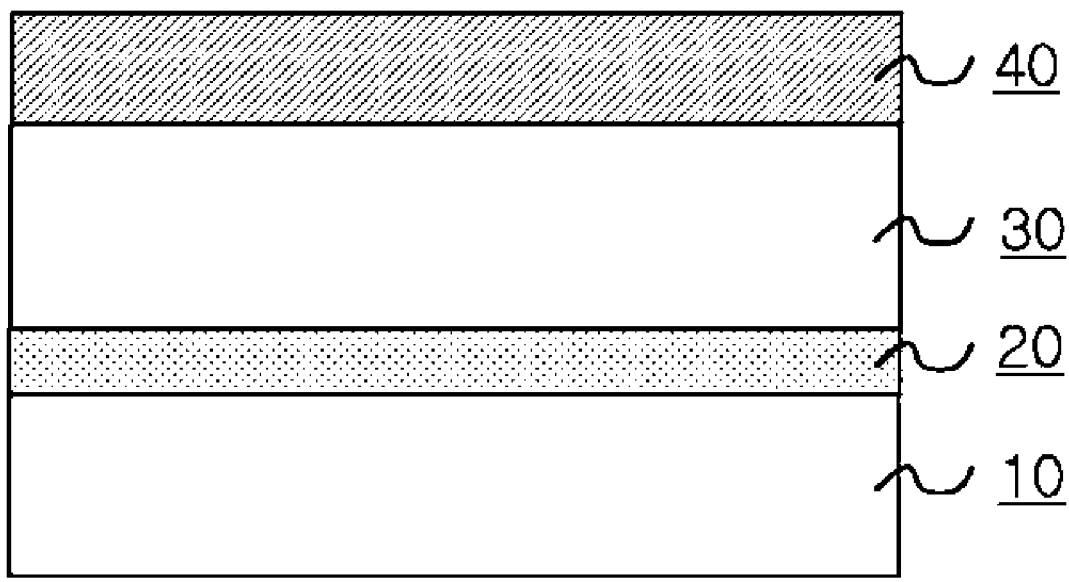
FIG. 1 illustrates the structure of general organic light emitting diode.
Figure 2:
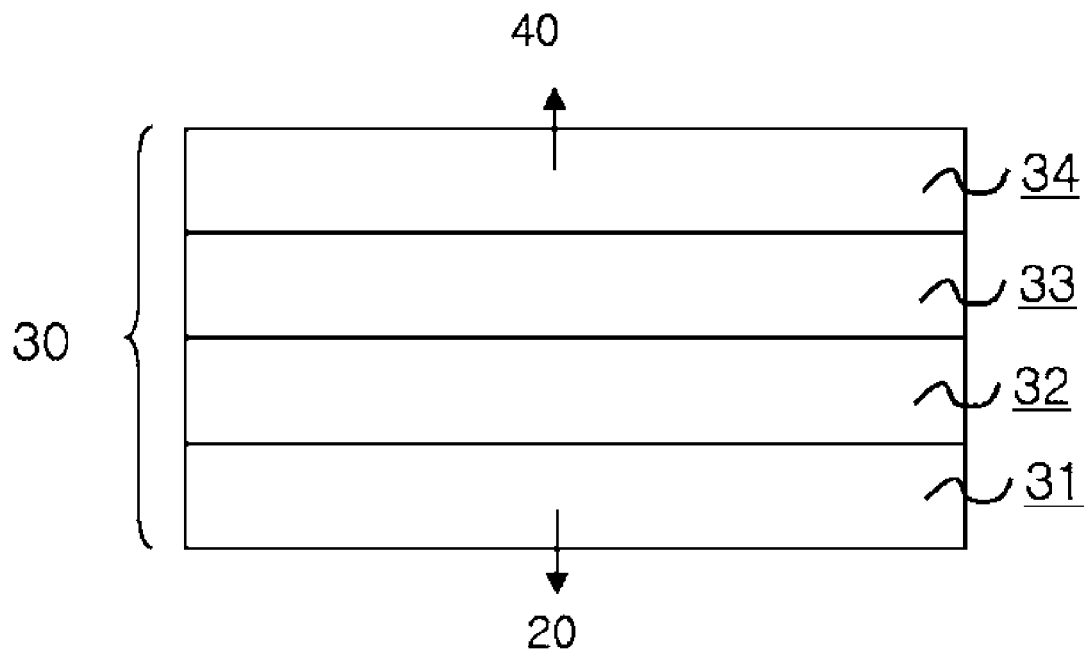
FIG. 2 illustrates the structure of organic material layer of the organic light emitting diode of FIG. 1.

On the same substrate used in Example, the normal organic light emitting diode shown in FIG. 1 was manufactured. In particular, the IZO anode, the hole injection layer, the hole transport layer, the light emitting layer, the electron transport layer, and the cathode made of lithium fluoride and aluminum were sequentially formed on the substrate. Each layer was formed under the same conditions as in Example. When a current of 50 mA/cm² was applied, the driving voltage was 5.5 V and illuminance was 11.9 lumen. After attaching the light extraction film having the structure of FIG. 9 on the glass substrate in the organic light emitting diode, when a current of the same magnitude was applied, illuminance of 13.9 lumen was observed. After attachment of the light extraction film on the glass substrate, the illuminance was improved by 17%.

As shown in the results of Example and Comparative Example, the inverted organic light emitting diode is operated at a lower driving voltage and produces a higher light intensity at the same current, compared to the normal organic light emitting diode. The light extraction layer is attached on the top portion of the anode or on the bottom portion of glass substrate in each type of device, in which the device having the light extraction layer on the anode had the light extraction efficiency of 1.6 times more than that of the device having the light extraction layer on the glass substrate. Consequently, it was found that the device having the light extraction layer on the transparent electrode formed on the organic material layer had much higher light extraction efficiency than the device having the light extraction layer on the substrate.

The invention claimed is:

1. An organic light emitting diode comprising
   a substrate,
   a first electrode provided on the substrate,
   one or more organic material layers provided on the first electrode,
   a second electrode provided on the organic material layer,
   a light extraction layer provided on the top portion of the second electrode, and
   an adhesion layer between the second electrode and the light extraction layer,
   wherein the adhesion layer is interposed between the second electrode and the light extraction layer, and the difference in the refractive index between the adhesion layer and second electrode and the difference in the refractive index between the adhesion layer and the light extraction layer are 0.5 or less, respectively.

2. The organic light emitting diode according to claim 1, wherein the light extraction layer is disposed in contact with the second electrode, and a difference in the refractive index between the light extraction layer and second electrode is 0.5 or less.

3. The organic light emitting diode according to claim 1, wherein the light extraction layer has transmittance of more than 50% in wavelength of the visible ray region.

4. The organic light emitting diode according to claim 1, wherein the light extraction layer has an average refractive index from 1.3 to 2.5.

5. The organic light emitting diode according to claim 1, wherein the light extraction layer is formed in a surface relief structure, a lens structure, a mixed layer structure of materials having different refractive index, or a trapezoidal-cross-section shape.

6. The organic light emitting diode according to claim 1, wherein the light extraction layer has a multilayer structure consisting of a support layer attached to the second electrode and a layer having a structure for light extraction.

7. The organic light emitting diode according to claim 1, wherein the organic light emitting diode is a top emission type or a both-side emission type.

8. The organic light emitting diode according to claim 1, wherein the organic light emitting diode is an inverted OLED.

9. The organic light emitting diode according to claim 1, wherein a thin film of an insulating material is interposed between the first electrode and the organic material layer.

10. The organic light emitting diode according to claim 1, wherein the second electrode is made of metal oxide or alloy oxide.

11. The organic light emitting diode according to claim 1, wherein the second electrode is made of a conductive polymer.

12. The organic light emitting diode according to claim 1, wherein the second electrode is made of a material having a refractive index of 1.7 to 2.3.

13. The organic light emitting diode according to claim 1, further comprising a protection layer between the second electrode and the light extraction layer.

14. The organic light emitting diode according to claim 13, wherein the protection layer is formed by deposition of silicon oxide, silicon nitride, or silicon oxynitride.

15. The organic light emitting diode according to claim 13, wherein the protection layer is interposed between the second electrode and the light extraction layer, and the difference in the refractive index between the protection layer and second electrode and the difference in the refractive index between the protection layer and the light extraction layer are 0.5 or less, respectively.

16. An organic light emitting diode comprising
    a substrate,
    a first electrode provided on the substrate,
    two or more light emitting units that are provided on the first electrode and include one or more organic material layers,
    a middle electrode provided between the light emitting units,
    a second electrode provided on the light emitting unit,
    a light extraction layer provided on the second electrode, and
    an adhesion layer between the second electrode and the light extraction layer,
    wherein the adhesion layer is interposed between the second electrode and the light extraction layer, and the difference in the refractive index between the adhesion layer and second electrode and the difference in the refractive index between the adhesion layer and the light extraction layer are 0.5 or less, respectively.

17. The organic light emitting diode according to claim 16, wherein the light extraction layer is disposed in contact with the second electrode, and a difference in the refractive index between the light extraction layer and second electrode is 0.5 or less.

18. The organic light emitting diode according to claim 16, wherein the light extraction layer has transmittance of more than 50% in wavelength of the visible ray region.

19. The organic light emitting diode according to claim 16, wherein the light extraction layer has an average refractive index from 1.3 to 2.5.

20. The organic light emitting diode according to claim 16, wherein the light extraction layer is formed in a surface relief structure, a lens structure, a mixed layer structure of materials having different refractive index, or a trapezoidal-cross-section shape.

21. The organic light emitting diode according to claim 16, wherein the light extraction layer has a multilayer structure consisting of a support layer attached to the second electrode and a layer having a structure for light extraction.

22. The organic light emitting diode according to claim 16, wherein the organic light emitting diode is a top emission type or a both-side emission type.

23. The organic light emitting diode according to claim 16, wherein the organic light emitting diode is an inverted OLED.

24. The organic light emitting diode according to claim 16, wherein a thin film of an insulating material is interposed between the first electrode and the organic material layer.

25. The organic light emitting diode according to claim 16, wherein the second electrode is made of metal oxide or alloy oxide.

26. The organic light emitting diode according to claim 16, wherein the second electrode is made of a conductive polymer.

27. The organic light emitting diode according to claim 16, wherein the second electrode is made of a material having a refractive index of 1.7 to 2.3.

28. The organic light emitting diode according to claim 16, further comprising a protection layer between the second electrode and the light extraction layer.

29. The organic light emitting diode according to claim 28, wherein the protection layer is formed by deposition of silicon oxide, silicon nitride, or silicon oxynitride.

30. The organic light emitting diode according to claim 28, wherein the protection layer is interposed between the second electrode and the light extraction layer, and the difference in the refractive index between the protection layer and second electrode and the difference in the refractive index between the protection layer and the light extraction layer are 0.5 or less, respectively.

31. A method for manufacturing an organic light emitting diode, comprising the steps of forming a first electrode on a substrate, forming one or more organic material layers on the first electrode, forming a second electrode on the organic material layer, forming a light extraction layer on the top portion of the second electrode, and forming an adhesion layer between the second electrode and the light extraction layer, wherein the difference in the refractive index between the adhesion layer and second electrode and the difference in the refractive index between the adhesion layer and the light extraction layer are 0.5 or less, respectively.

32. A method for manufacturing an organic light emitting diode, comprising the steps of forming a first electrode on a substrate, forming two or more light emitting units that includes one or more organic material layers on the first electrode, forming a middle electrode after forming any one of the light emitting units, forming a second electrode on the light emitting unit, forming a light extraction layer on the second electrode, and forming an adhesion layer between the second electrode and the light extraction layer, wherein the difference in the refractive index between the adhesion layer and second electrode and the difference in the refractive index between the adhesion layer and the light extraction layer are 0.5 or less, respectively.

* * * * *